US012512067B2

(12) United States Patent
Ko et al.

(10) Patent No.: US 12,512,067 B2
(45) Date of Patent: Dec. 30, 2025

(54) GATE SIGNAL GENERATING CIRCUIT AND DISPLAY DEVICE INCLUDING THE SAME

(71) Applicant: LG Display Co., Ltd., Seoul (KR)

(72) Inventors: Young Hyun Ko, Paju-si (KR); Chan Yong Jeong, Paju-si (KR); Ju Heyuck Baeck, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/940,164

(22) Filed: Nov. 7, 2024

(65) Prior Publication Data

US 2025/0218393 A1 Jul. 3, 2025

(30) Foreign Application Priority Data

Dec. 28, 2023 (KR) ........................ 10-2023-0195541

(51) Int. Cl.
*G09G 3/3266* (2016.01)
*H10D 86/40* (2025.01)
*H10D 86/60* (2025.01)

(52) U.S. Cl.
CPC ......... *G09G 3/3266* (2013.01); *H10D 86/471* (2025.01); *H10D 86/60* (2025.01); *G09G 2300/0408* (2013.01); *G09G 2300/0842* (2013.01); *G09G 2310/0286* (2013.01)

(58) Field of Classification Search
None
See application file for complete search history.

(56) References Cited

U.S. PATENT DOCUMENTS

2013/0009925 A1* 1/2013 Ueda .................... G09G 3/3677 345/204
2014/0184484 A1* 7/2014 Miyake ................ G09G 3/3688 345/87
2023/0274687 A1* 8/2023 In ......................... G09G 3/2096

FOREIGN PATENT DOCUMENTS

KR 10-2022-0037659 A 3/2022

* cited by examiner

*Primary Examiner* — Nitin Patel
*Assistant Examiner* — Amen W Bogale
(74) *Attorney, Agent, or Firm* — Birch, Stewart, Kolasch & Birch, LLP

(57) ABSTRACT

A display device in one example includes a display panel configured to display an image and a gate signal generating circuit configured to supply a gate signal to the display panel. The gate signal generating circuit includes a signal control circuit configured to control a Q node and a signal output circuit configured to operate based on a voltage of the Q node to output the gate signal. The signal output circuit includes at least one pull-up transistor and at least one pull-down transistor each including a gate electrode connected to the Q node in common.

8 Claims, 18 Drawing Sheets

(operating state table)

GATE SIGNAL GENERATING CIRCUIT AND DISPLAY DEVICE INCLUDING THE SAME

CROSS-REFERENCE TO RELATED APPLICATIONS

This application claims priority to Korean Patent Application No. 10-2023-0195541, filed in the Republic of Korea on Dec. 28, 2023, the entire contents of which is hereby expressly incorporated by reference as if fully set forth herein into the present application.

BACKGROUND

Field of the Invention

The present disclosure relates to a gate signal generating circuit and a display device including the same.

Discussion of the Related Art

As information technology advances, the market for display devices which are a connection medium for connecting a user with information is growing. Therefore, the use of display devices such as light emitting display devices, quantum dot display (QDD) apparatuses, and liquid crystal display (LCD) apparatuses is increasing.

The display devices described above include a display panel having a plurality of subpixels, a driver which outputs a driving signal for driving the display panel, and a power supply which generates power to be supplied to the display panel or the driver.

In such display devices, when the driving signal (for example, a scan signal and a data signal) is supplied to each of the subpixels provided in the display panel, a selected subpixel can transmit light or can self-emit light and thus, an image can be displayed.

SUMMARY OF THE DISCLOSURE

The present disclosure can simplify a circuit configuring a shift register, based on at least two transistors having different threshold voltage characteristics, and thus, can implement a narrow bezel of a display panel.

To achieve these objects and other advantages and in accordance with the purpose of the disclosure, as embodied and broadly described herein, a display device including: a display panel configured to display an image; and a gate signal generating circuit configured to supply a gate signal to the display panel, wherein the gate signal generating circuit includes a signal control circuit configured to control a Q node and a signal output circuit configured to operate based on a voltage of the Q node to output the gate signal, and the signal output circuit includes at least one pull-up transistor and at least one pull-down transistor each including a gate electrode connected to the Q node in common.

At least one of the pull-up transistor and the pull-down transistor can include a first gate electrode disposed in a lower layer of a semiconductor layer and a second gate electrode disposed in an upper layer of the semiconductor layer.

The at least one pull-up transistor can include a first gate electrode disposed in a lower layer of a semiconductor layer and a second gate electrode disposed in an upper layer of the semiconductor layer.

The first gate electrode can be connected to an output terminal of the signal output circuit unit.

When the pull-up transistor is turned on, a first voltage can be applied to the first gate electrode, and a second voltage which is lower than the first voltage can be applied to the second gate electrode.

When the pull-up transistor is turned off, a third voltage which is lower than the second voltage can be applied to the first gate electrode, and the first voltage can be applied to the second gate electrode.

In the pull-up transistor or the pull-down transistor, a shape of at least one of a semiconductor layer, a gate insulation layer, and a gate electrode can differ.

In another aspect of the present disclosure, a gate signal generating circuit including: a signal control circuit configured to control a Q node; and a signal output circuit configured to operate based on a voltage of the Q node to output a gate signal, wherein the signal output circuit includes at least one pull-up transistor and at least one pull-down transistor each including a gate electrode connected to the Q node in common.

The at least one pull-up transistor can include a first gate electrode disposed in a lower layer of a semiconductor layer and a second gate electrode disposed in an upper layer of the semiconductor layer.

When the pull-up transistor is turned on, a first voltage can be applied to the first gate electrode and a second voltage which is lower than the first voltage can be applied to the second gate electrode, and when the pull-up transistor is turned off, a third voltage which is lower than the second voltage can be applied to the first gate electrode and the first voltage can be applied to the second gate electrode.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION OF THE EMBODIMENTS

Figure 1:
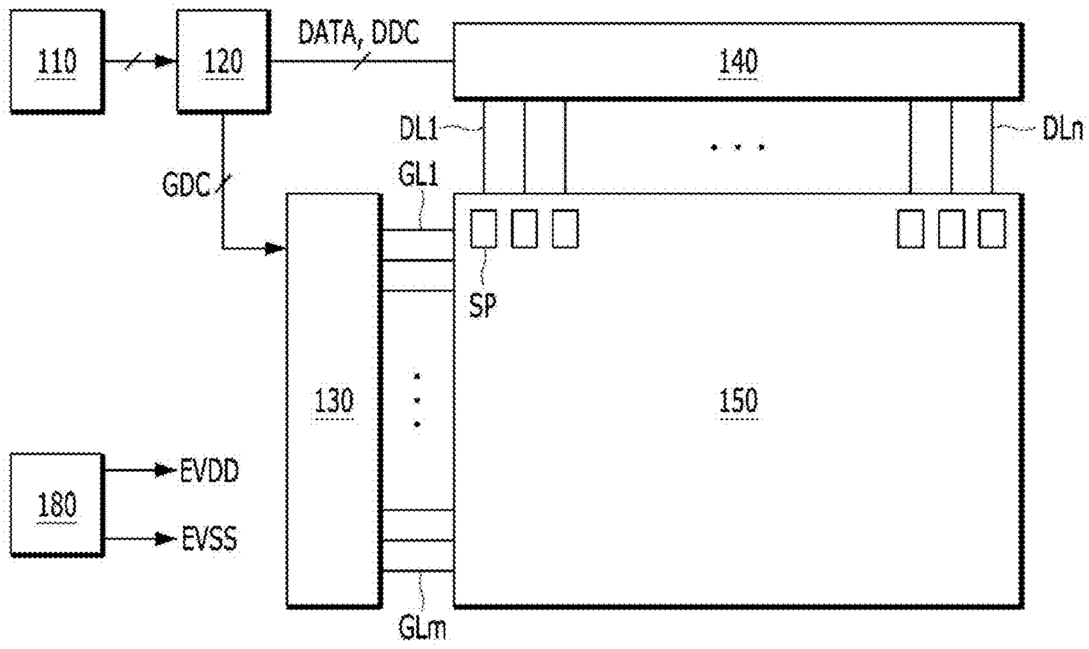
FIG. 1 is a block diagram schematically illustrating a light emitting display device.

Hereinafter, the present disclosure will be described more fully with reference to the accompanying drawings, in which example embodiments of the disclosure are shown. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. Further, the term "can" fully encompasses all the meanings and coverages of the term "may."

A display device according to the present disclosure can be applied to televisions (TVs), video players, personal computers (PCs), home theaters, electronic devices for vehicles, and smartphones, but is not limited thereto. The display device according to the present disclosure can be implemented as a light emitting display device, an electrophoretic display device, a quantum dot display (QDD) apparatus, or a liquid crystal display (LCD) apparatus, a micro LED (Light Emitting Device) display device, or a mini LED display device. Hereinafter, for convenience of description, a light emitting display device self-emitting light by using an inorganic light emitting diode or an organic light emitting diode will be described for example.

Moreover, a transistor described below can be implemented with an n-type transistor, a p-type transistor, or a combination of an n-type transistor and a p-type transistor. A transistor can be a three-electrode element including a gate, a source, and a drain. The source can be an electrode which provides a carrier to a transistor. In the transistor, a carrier can start to flow from the source. The drain can be an electrode where the carrier flows from the transistor to the outside. For example, in the transistor, the carrier flows from the source to the drain.

In the p-type transistor, because a carrier is a hole, a source voltage can be higher than a drain voltage so that the hole flows from the source to the drain. In the p-type transistor, because the hole flows from the source to the drain, a current can flow from the source to the drain. On the other hand, in the n-type transistor, because a carrier is an electron, a source voltage can be lower than a drain voltage so that the electron flows from the source to the drain. In the n-type transistor, because the electron flows from the drain to the source, a current can flow from the drain to the source. However, a source and a drain of a transistor can switch therebetween based on a voltage applied thereto. Based thereon, in the following description, one of a source and a drain will be described as a first electrode, and the other of the source and the drain will be described as a second electrode.

Hereinbelow, various embodiments of the present disclosure will be discussed by referring to the drawings. All the components of each display device according to all embodiments of the present disclosure are operatively coupled and configured.

Figure 2:
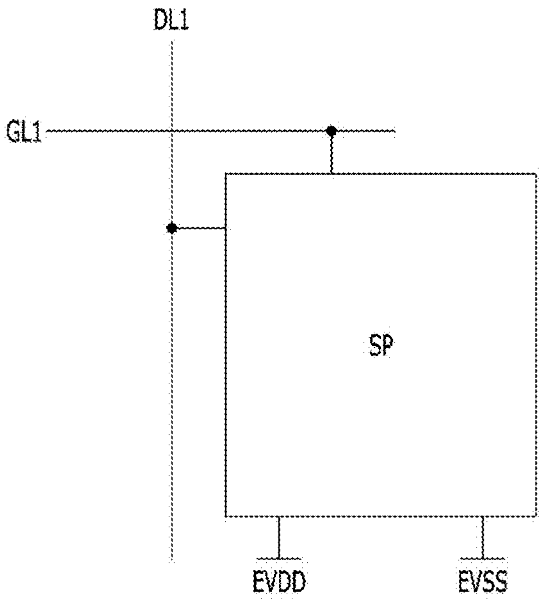
FIG. 2 is a diagram schematically illustrating a subpixel illustrated in FIG. 1.

FIG. 1 is a block diagram schematically illustrating a light emitting display device according to one or more embodiments of the present disclosure, and FIG. 2 is a diagram schematically illustrating a subpixel illustrated in FIG. 1.

As illustrated in FIGS. 1 and 2, the light emitting display device according to an embodiment of the present disclosure can include a video supply unit 110, a timing controller 120, a gate driver (a gate signal generating circuit) 130, a data driver 140, a display panel 150, and a power supply 180.

The video supply unit 110 (a set or a host system) can output a video data signal supplied from the outside or various driving signals and an image data signal (a video data signal) stored in an internal memory thereof. The video supply unit 110 can supply a data signal and the various driving signals to the timing controller 120.

The timing controller 120 can output a gate timing control signal GDC for controlling an operation timing of the gate driver 130, a data timing control signal DDC for controlling an operation timing of the data driver 140, and various synchronization signals (a vertical synchronization signal VSYNC and a horizontal synchronization signal HSYNC). Here, the horizontal synchronization signal HSYNC is a signal representing a time taken to display one horizontal line of a screen and the vertical synchronization signal VSYNC is a signal representing a time taken to display a screen of one frame. The timing controller 120 can provide the data driver 140 with the data timing control signal DDC and a data signal DATA supplied from the video supply unit 110. The timing controller 120 can be implemented as various circuits or electronic components, such as an integrated circuit (IC) type and can be mounted on a printed circuit board (PCB), but is not limited thereto. Alternatively, the timing controller 120 may be implemented as a field programmable gate array (FPGA), an application specific integrated circuit (ASIC), or a processor, without being limited thereto.

The gate driver 130 can output a gate signal (or a gate voltage) in response to the gate timing control signal GDC supplied from the timing controller 120. The gate driver 130 is a circuit configured to drive a plurality of gate lines GL1 to GLm, and may output gate signal to the plurality of gate lines GL1 to GLm. The gate driver 130 can supply the gate signal to a plurality of subpixels, included in the display panel 150, through a plurality of gate lines GL1 to GLm, where m is a real number such as a positive integer. The gate driver 130 can be implemented as an IC type or can be directly provided on the display panel 150 in a GIP type, but is not limited thereto. Alternatively, the gate driver 130 may be directly provided on the display panel 150 in the chip-on-glass (COG) type, the chip-on-film (COF) type, or the like.

In response to the data timing control signal DDC supplied from the timing controller 120, the data driver 140 can sample and latch the data signal DATA, convert a digital data signal into an analog data voltage, based on a gamma reference voltage, and output the analog data voltage. The data driver 140 is a circuit configured to drive a plurality of data lines DL1 to DLn, and may output data signals such as data voltages to the plurality of data lines DL1 to DLn. The data driver 140 can respectively supply data voltages to the subpixels of the display panel 150 through a plurality of data lines DL1 to DLn, where n is a real number such as a positive integer. The data driver 140 can be implemented as an IC type or can be mounted on the display panel 150 or a PCB, but is not limited thereto.

The power supply 180 can generate a high-level voltage and a low-level voltage, based on an external input voltage supplied from the outside, and can output the high-level voltage and the low-level voltage through a first power line EVDD and a second power line EVSS. The power supply 180 can generate and output a voltage (for example, a gate voltage including a gate high voltage and a gate low voltage) needed for driving of the gate driver 130 or a voltage (a drain voltage including a drain voltage and a half drain voltage) needed for driving of the data driver 140, in addition to the high-level voltage and the low-level voltage.

The display panel 150 can display an image (video), based on a driving voltage including the high-level voltage and the low-level voltage and a driving signal including the gate signal and a data voltage. The subpixels of the display panel 150 can each self-emit light. The display panel 150 can be manufactured based on a substrate, having stiffness or flexibility, such as glass, silicon, or polyimide. Alternatively, the substrate may include a flexible polymer film. For example, the flexible polymer film may be made of any one of polyethylene terephthalate (PET), polycarbonate (PC), acrylonitrile-butadiene-styrene copolymer (ABS), polymethyl methacrylate (PMMA), polyethylene naphthalate (PEN), polyether sulfone (PES), cyclic olefin copolymer (COC), triacetylcellulose (TAC) film, polyvinyl alcohol (PVA) film, polyimide (PI) film, and polystyrene (PS), which is only an example and is not necessarily limited thereto. Each of a plurality of subpixels may emit light having different wavelengths from each other. The plurality of subpixels may include first to third sub pixels which emit different color light from each other. Further, the subpixels emitting light can include pixels including red, green, and blue, in which the red, green, and blue sub-pixels may be disposed in a repeated manner or can include pixels including red, green, blue, and white, in which the red, green, blue, and white sub-pixels may be disposed in a repeated manner, or the red, green, blue, and white sub-pixels may be disposed in a quad type.

For example, one subpixel SP can be connected to a first data line DL1, a first gate line GL1, a first power line EVDD, and a second power line EVSS and can include a pixel circuit which includes a switching transistor, a driving transistor, a capacitor, and an organic light emitting diode. The subpixel SP used in the light emitting display device can self-emit light and can be complicated in configuration of a circuit. Further, an organic light emitting diode emitting light can be diversified, and a compensation circuit which compensates for a degradation in a driving transistor supplying a driving current needed for driving of the organic light emitting diode can be diversified. Accordingly, the subpixel SP can be simply illustrated in a block shape. In the pixel circuit of the present disclosure, various configurations of compensation circuits are possible.

Hereinabove, each of the timing controller 120, the gate driver 130, and the data driver 140 has been described as an individual element. However, based on an implementation type of the light emitting display device, one or more of the timing controller 120, the gate driver 130, and the data driver 140 can be integrated into one IC, without being limited thereto.

Figure 3:
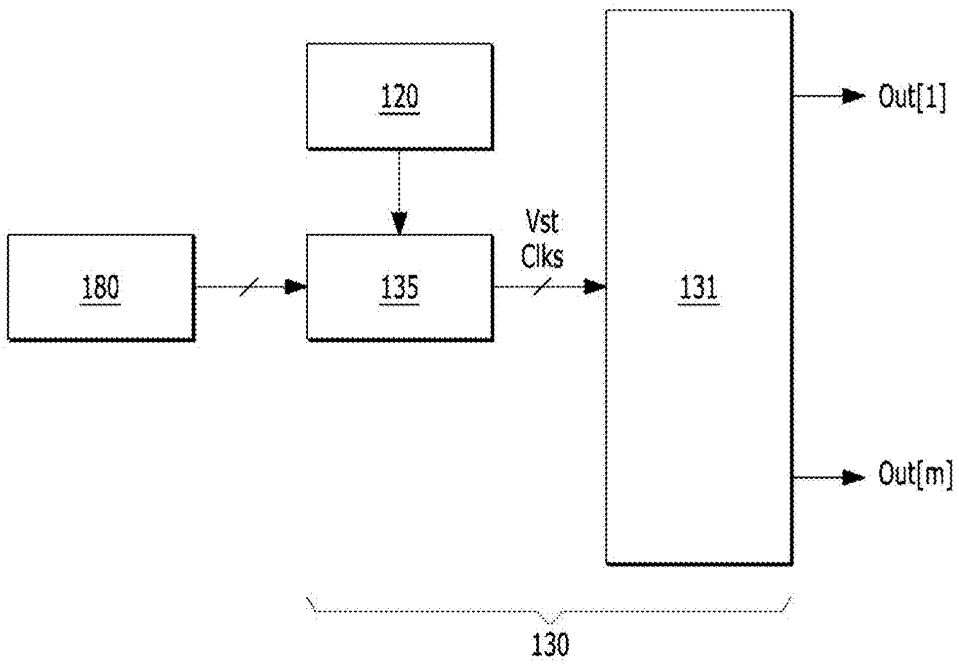
FIGS. 3 and 4 are diagrams for describing a configuration of a gate driver of a gate in panel (GIP) type.
Figure 4:
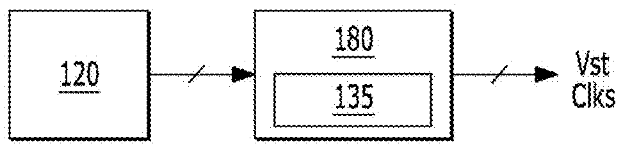
Figure 5:
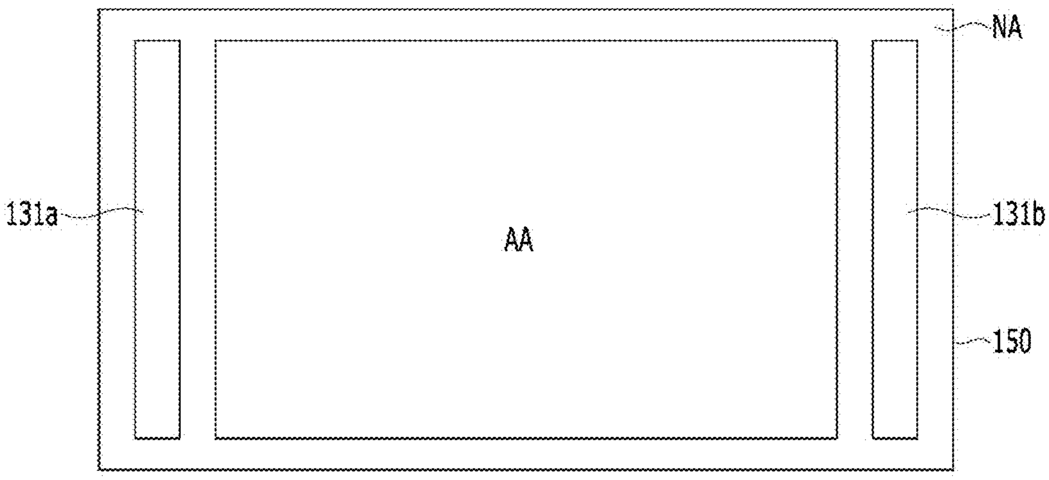
FIG. 5 is a diagram illustrating an arrangement example of a GIP-type gate driver.

FIGS. 3 and 4 are diagrams for describing a configuration of a GIP-type gate driver 130 according to an embodiment of the present disclosure, and FIG. 5 is a diagram illustrating an arrangement example of the GIP-type gate driver 130.

As illustrated in FIG. 3, the GIP-type gate driver 130 can include a shift register 131 and a level shifter 135. The level shifter 135 can generate scan clock signals Clks and a start signal Vst, based on signals and voltages output from the timing controller 120 and the power supply 180. The shift register 131 can operate based on the clock signals Clks and the start signal Vst output from the level shifter 135 and can output gate signals Gout[1] to Gout[m] through the output terminals Out[1] to Out[m].

As illustrated in FIGS. 3, the level shifter 135 can be independently provided as an IC type unlike the shift register 131, or as illustrated in FIG. 4, the level shifter 135 can be included in the power supply 180. However, this can be merely an embodiment, and embodiments of the present disclosure are not limited thereto.

As illustrated in FIG. 5, the display panel 150 may include a display area AA and a non-display area NA disposed in the vicinity of the display area AA, surrounding the display area AA, or around the display area AA. As illustrated in FIG. 5, in the GIP-type gate driver 130, first and second shift registers 131*a* and 131*b* outputting gate signals can be disposed in a non-display area NA of the display panel 150. The first and second shift registers 131*a* and 131*b* can be formed as a thin film type in the display panel 150, based on the GIP type. An example where the first and second shift registers 131*a* and 131*b* are respectively disposed in left and right non-display areas NA of the display panel 150, but embodiments of the present disclosure are not limited thereto.

Figure 6:
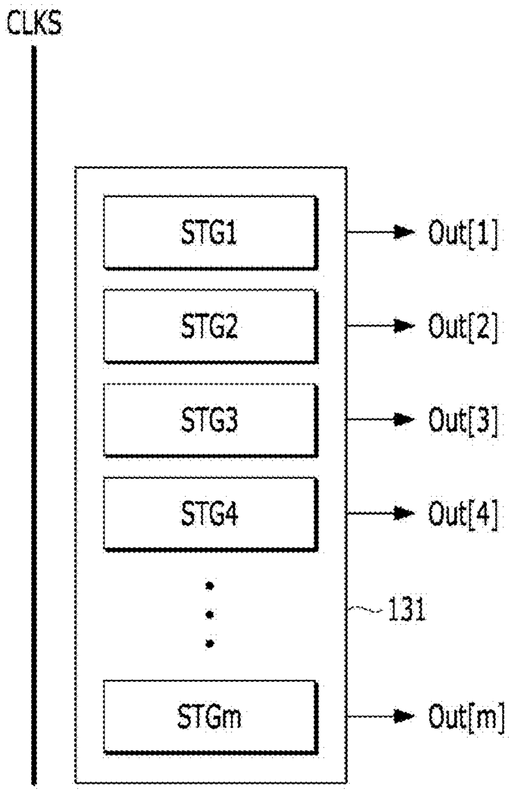
FIG. 6 is a block diagram illustrating a shift register according to a first embodiment of the present disclosure.
Figure 7:
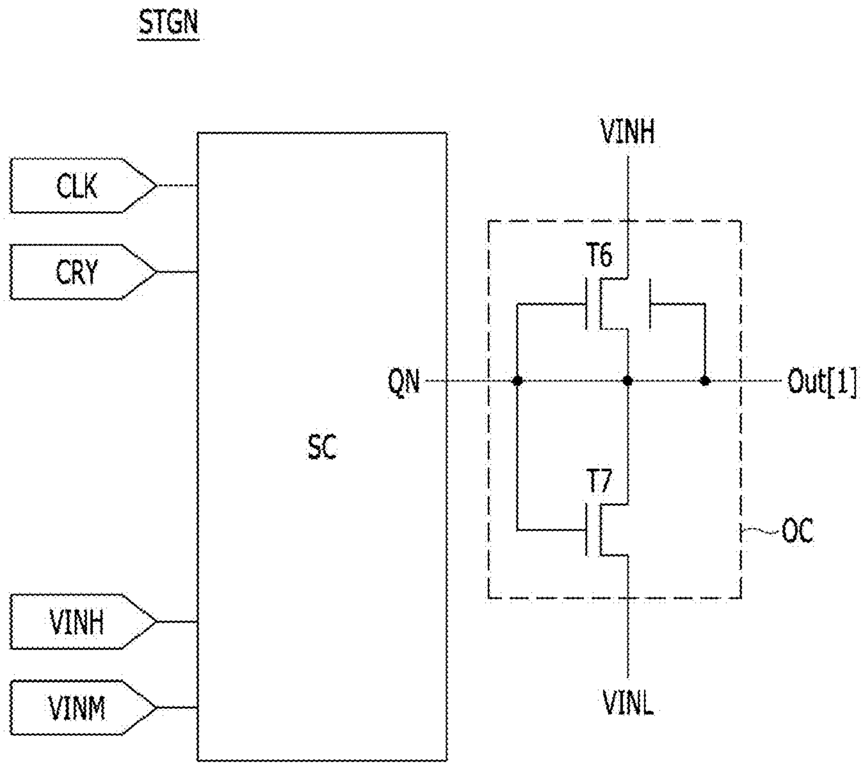
FIG. 7 is a first example diagram illustrating some elements of an $N^{th}$ stage in the shift register illustrated in FIG. 6.
Figure 8:
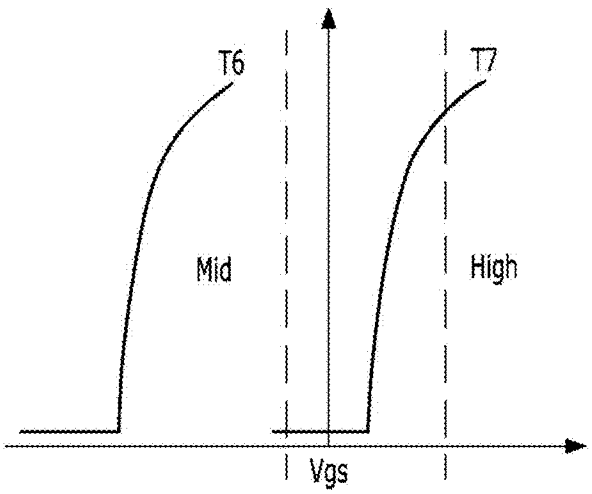
FIG. 8 is a diagram for describing characteristics of transistors included in a signal output circuit unit.
Figure 9:
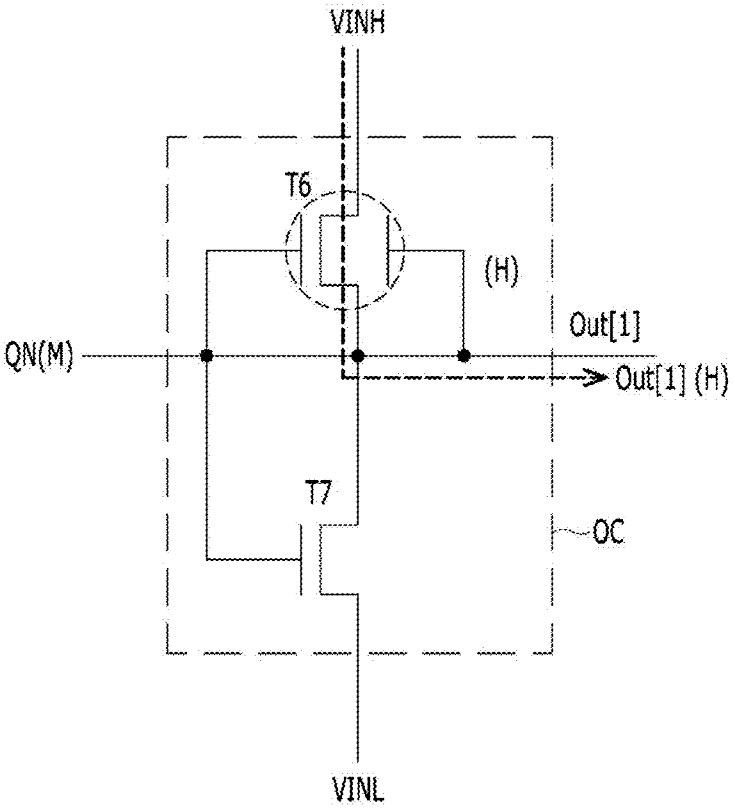
FIGS. 9 and 10 are diagrams for describing an operation of the signal output circuit unit.
Figure 10:
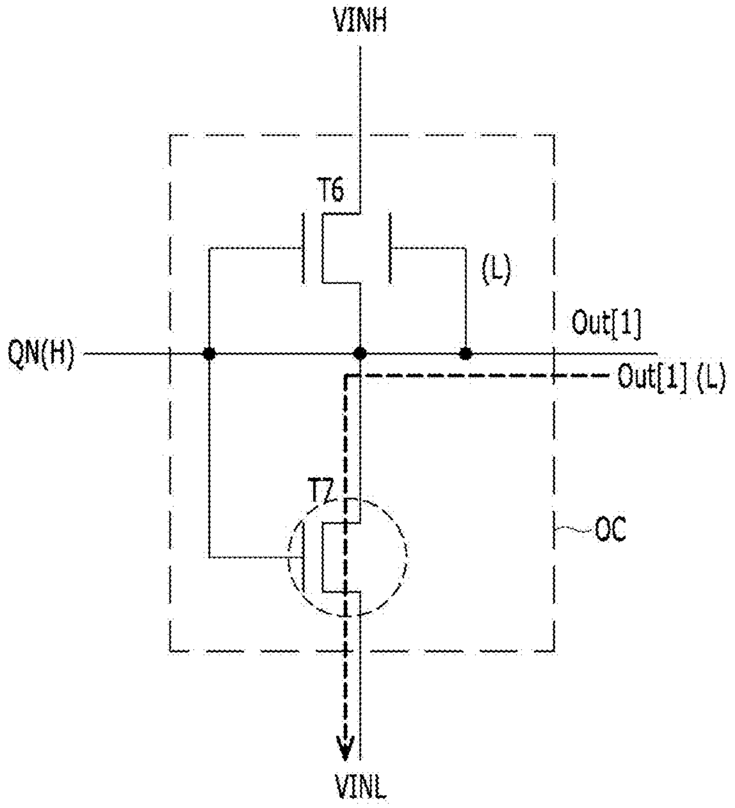

FIG. 6 is a block diagram illustrating a shift register 131 according to a first embodiment of the present disclosure, FIG. 7 is a first example diagram illustrating some elements of an $N^{th}$ stage in the shift register 131 illustrated in FIG. 6, FIG. 8 is a diagram for describing characteristics of transistors included in a signal output circuit unit according to aspects of the present disclosure, and FIGS. 9 and 10 are diagrams for describing an operation of the signal output circuit unit according to aspects of the present disclosure.

As illustrated in FIG. 6, the shift register 131 according to the first embodiment can include first to $M^{th}$ stages STG1 to STGm. For example, the shift register 131 according to the first exemplary embodiment may include first to Mth stages STG1 to STGm which operate based on clock signals applied through clock signal lines CLKS and output gate signals Gout[1] to Gout[m] through the output terminals Out[1] to Out[m].

The first to $M^{th}$ stages STG1 to STGm can have a dependent connection relationship to output the gate signals Gout[1] to Gout[m] through the output terminals Out[1] to Out[m] in order or in reverse order. As one example, the output terminal (for example, a carry signal output terminal) of the first stage STG1 may be connected to an input terminal (for example, a start signal input terminal) of an Ith stage (where I may be an integer of 2 or more). For example, an output terminal (for example, a carry signal output terminal) of the first stage STG1 can be connected to an input terminal (for example, a start signal input terminal) of the second stage STG2. However, this can be merely one embodiment, and the output terminal of the first stage STG1 can be connected to an input terminal of an Ith stage (where I can be an integer of 2 or more).

As illustrated in FIGS. 6 and 7, an $N^{th}$ stage STGN according to the first embodiment can include a signal control circuit unit SC and a signal output circuit unit OC, without being limited thereto. Here, the $N^{th}$ stage STGN can correspond to one of stages included in the first to $M^{th}$ stages STG1 to STGm.

The signal control circuit unit SC can be connected to a clock signal line CLK, a carry signal line CRY, a first input line VINH, a second input line VINM, and a third input line VINL. The signal control circuit unit SC may receive a clock signal applied through the clock signal line CLK, a carry signal applied through the carry signal line CRY, a first voltage applied through the first input line VINH, a second voltage applied through the second input line VINM, and a third voltage applied through the third input line VINL. The signal control circuit unit SC can operate and control a Q node QN, based on a clock signal applied through the clock signal line CLK, a carry signal (a start signal in a case of the first stage) applied through the carry signal line CRY, a first voltage applied through the first input line VINH, a second voltage applied through the second input line VINM, and a third voltage applied through the third input line VINL. Levels of the first to third voltages can have a relationship of "first voltage>second voltage>third voltage". However, this may be merely an embodiment, and embodiments of the present disclosure are not limited thereto.

To control the signal output circuit unit OC, the signal control circuit unit SC can operate based on the clock signal, the carry signal, the first voltage, and the second voltage and can control an internal circuit so that the first voltage or the second voltage is charged in the Q node QN.

The signal output circuit unit OC can be connected to the Q node QN, the first input line VINH, and the third input line VINL of the signal control circuit unit SC. The signal output circuit unit OC can operate based on a voltage charged in the Q node QN and can output, as a gate signal, the first voltage applied through the first input line VINH or the third voltage applied through the third input line VINL. A gate signal output based on the first voltage can be defined as a gate high voltage, and a gate signal output based on the third voltage can be defined as a gate low voltage, without being limited thereto.

The signal output circuit unit OC can include a pull-up transistor T6 and a pull-down transistor T7. The pull-up transistor T6 can include a first electrode, a second electrode, and two gate electrodes, and the pull-down transistor T7 can include a first electrode, a second electrode, and one gate electrode. The pull-up transistor T6, unlike the pull-down transistor T7, can include two gate electrodes which are respectively disposed in a lower layer and an upper layer with respect to a semiconductor layer. A portion relevant thereto can refer to a cross-sectional surface described below. For example, the first electrode of the pull-up transistor T6 may be source or drain electrode, and the second electrode of the pull-up transistor T6 may be drain or source electrode, without being limited thereto. Similarly, the first electrode of the pull-down transistor T7 may be source or drain electrode, and the second electrode of the pull-down transistor T7 may be drain or source electrode, without being limited thereto.

The pull-up transistor T6 can include a first gate electrode connected to the Q node QN, a second gate electrode connected to an output terminal OUT[1] thereof, the first electrode connected to the first input line VINH, and the second electrode connected to the output terminal OUT[1]. The pull-down transistor T7 can include a gate electrode connected to the Q node QN, the first electrode connected to the third input line VINL, and the second electrode connected to the output terminal OUT [1], without being limited thereto. Alternatively, the pull-down transistor T7 may include a first gate electrode and a second gate electrode. That is, at least one of the pull-up transistor T6 and the pull-down transistor T7 may comprise the first gate electrode and the second gate electrode.

As illustrated in FIGS. 6 to 8, the pull-up transistor T6 and the pull-down transistor T7 can have different threshold voltage characteristics. Referring to a graph associated with a gate-source voltage Vgs of FIG. 8, the pull-up transistor T6 can have a negative threshold voltage characteristic, and the pull-down transistor T7 can have a positive threshold voltage characteristic, without being limited thereto.

The pull-up transistor T6 can have the negative threshold voltage characteristic, and thus, can be turned on based on a second voltage Mid which is lower than a first voltage High. For example, the second voltage Mid can be set to a level close to 0 V. However, this may be merely one embodiment and may be changed based on a driving method and an implementation type of a light emitting display device. The pull-down transistor T7 can have the positive threshold voltage characteristic, and thus, can be turned on based on the first voltage High which is higher than the second voltage Mid. For example, the first voltage High can be set to a level close to 10 V to 20 V. However, this can be merely one embodiment and can be changed based on a driving method and an implementation type of a light emitting display device.

Furthermore, in FIGS. 8 to 10, an example where the pull-up transistor T6 has the negative threshold voltage characteristic and the pull-down transistor T7 has the positive threshold voltage characteristic can be described, but this can be opposite thereto. Alternatively, an example where the pull-down transistor T7 has the negative threshold voltage characteristic and the pull-up transistor T6 has the positive threshold voltage characteristic may be possible.

Hereinafter, for example, in a case where the pull-up transistor T6 has the negative threshold voltage characteristic and the pull-down transistor T7 has the positive threshold voltage characteristic, an operation will be described as follows.

The first gate electrode of the pull-up transistor T6 may be connected to the Q node QN. As illustrated in FIG. 9, the pull-up transistor T6 can be turned on when a second voltage M is charged in the Q node QN. When the pull-up transistor T6 is turned on, the signal output circuit unit OC can output a gate signal Out[1](H) of a gate high voltage through the output terminal OUT[1] thereof. The gate signal Out[1](H) of the gate high voltage can be generated based on the first voltage applied through the first input line VINH.

Moreover, the second gate electrode of the pull-up transistor T6 can be connected to the output terminal OUT[1] of the signal output circuit unit OC. Therefore, when the second voltage M is charged in the Q node QN, the pull-up transistor T6 can be put in a turn-on state by the second voltage M applied through the first gate electrode initially, and then, can be put in a turn-on state (turn-on characteristic stable maintenance/enhancement) by the first voltage H applied through the second gate electrode.

The gate electrode of the pull-down transistor T7 may be connected to the Q node QN. As illustrated in FIG. 10, when the first voltage H is charged in the Q node QN, the pull-down transistor T7 can be turned on. When the pull-down transistor T7 is turned on, the signal output circuit unit OC can output a gate signal Out[1](L) of a gate low voltage through the output terminal OUT[1]. The gate signal Out[1](L) of the gate low voltage can be generated based on a third voltage L applied through the third input line VINL.

Moreover, the second gate electrode of the pull-up transistor T6 can be connected to the output terminal OUT[1] of the signal output circuit unit OC. Therefore, when the first voltage H is charged in the Q node QN, the pull-up transistor T6 can be put in a turn-off state (off characteristic stable maintenance) by the third voltage L output through the output terminal OUT[1] of the signal output circuit unit OC.

Referring to the above description, the pull-up transistor T6 can have a turn-on condition because the first voltage H is applied to the second gate electrode, but as the third voltage L which is lower than the first voltage H is applied to the first gate electrode, a threshold voltage can move in a positive direction. Further, when a level of the third voltage L is applied to be sufficiently low, the pull-up transistor T6 can be turned off. Here, a condition for allowing a level of the third voltage L to be sufficiently low can be realized by a method which adjusts a ratio of a capacitor formed in the first gate electrode or the second gate electrode, or increases or decreases a level of a voltage used as the third voltage L.

Figure 11:
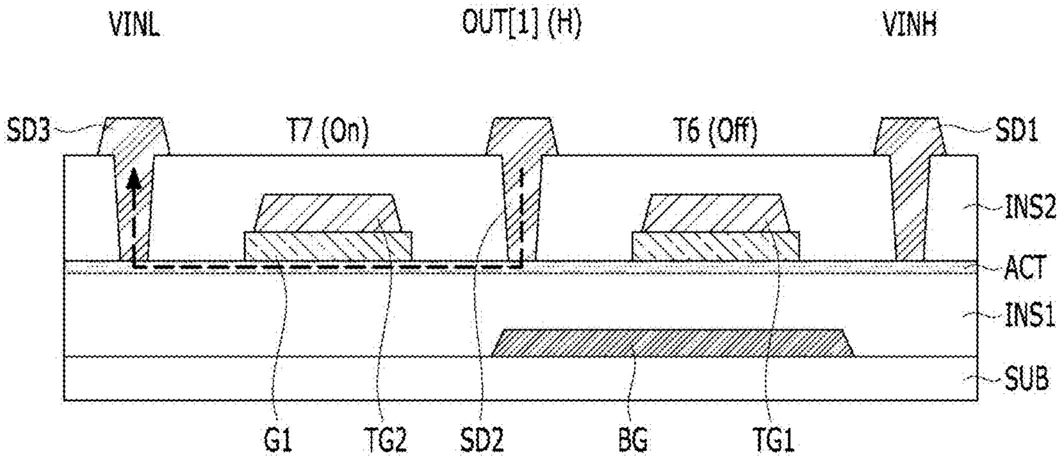
FIGS. 11 and 12 are diagrams illustrating a cross-sectional surface and an operating state of each of a pull-up transistor and a pull-down transistor illustrated in FIG. 7, and FIGS. 13 and 14 are diagrams for describing a comparative example and the first embodiment through comparison.
Figure 12:
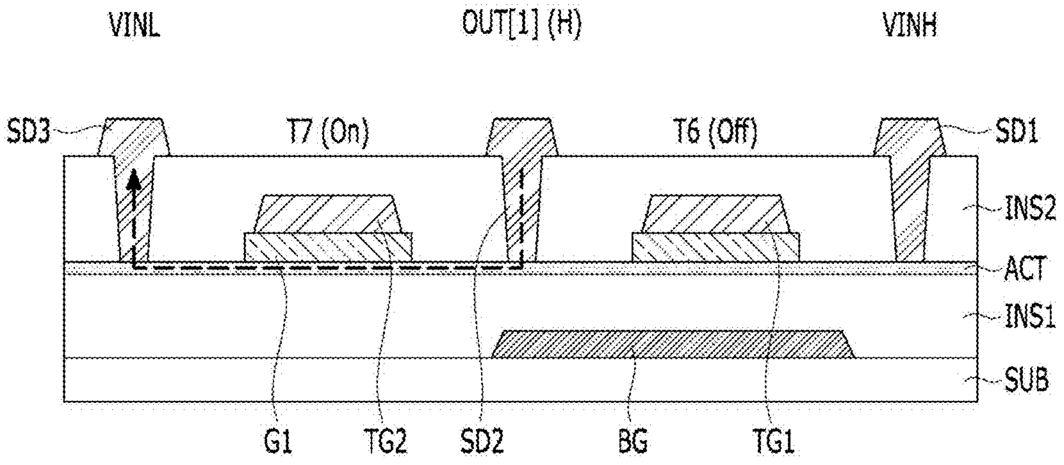
Figure 13:
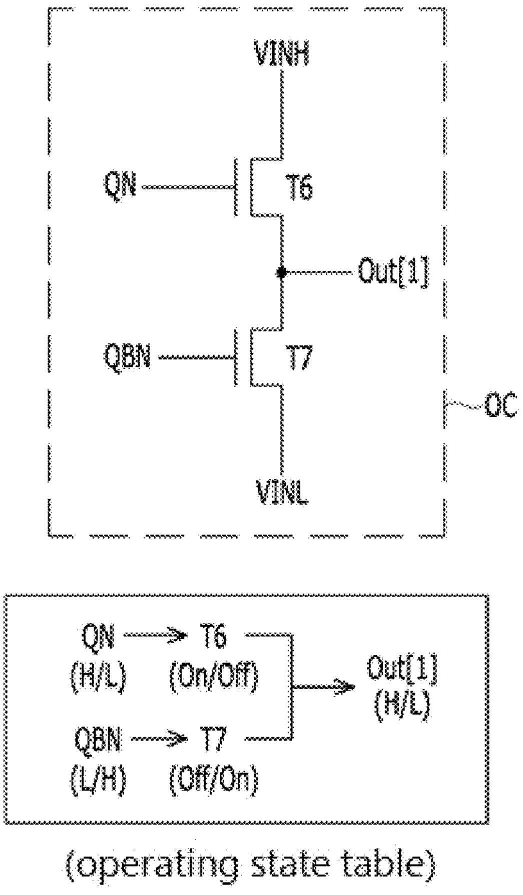
Figure 14:
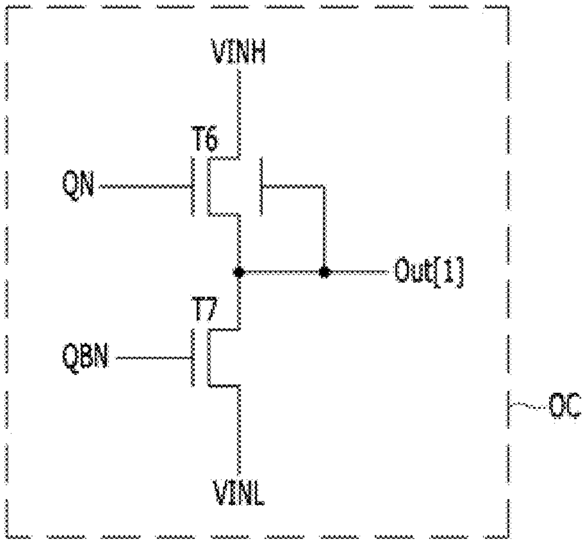
Figure 14:
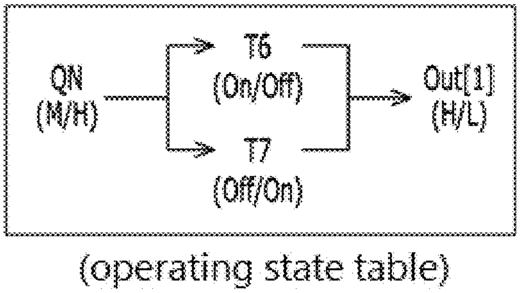

FIGS. 11 and 12 are diagrams illustrating a cross-sectional surface and an operating state of each of the pull-up transistor and the pull-down transistor illustrated in FIG. 7, and FIGS. 13 and 14 are diagrams for describing a comparative example and the first embodiment through comparison.

As illustrated in FIGS. 11 and 12, according to the first embodiment, the pull-up transistor T6 and the pull-down transistor T7 can be formed of an insulating material, a metal material, or a semiconductor material on a substrate SUB, and can be formed by a process of patterning the transistors in process sequence.

A first gate electrode BG of the pull-up transistor T6 can be disposed on the substrate SUB. The first gate electrode BG of the pull-up transistor T6 can be defined as a lower gate electrode. A first insulation layer INS1 covering the first gate electrode BG of the pull-up transistor T6 can be disposed on the substrate SUB. A semiconductor layer ACT of each of the pull-up transistor T6 and the pull-down transistor T7 can be disposed on the first insulation layer INS1. The semiconductor layer ACT can be selected as an oxide semiconductor, and the other region except a channel region covered by a second gate electrode TG1 of the pull-up transistor T6 and a gate electrode TG2 of the pull-down transistor T7 can be conductive and can have metal properties instead of semiconductor properties. As one example, the first gate electrode of at least one of the pull-up transistor T6 and the pull-down transistor T7 may be disposed in a lower layer of a semiconductor layer ACT and the second gate electrode of at least one of the pull-up transistor T6 and the pull-down transistor T7 may be disposed in an upper layer of the semiconductor layer ACT, without being limited thereto. For example, referring to FIG. 11, the first gate electrode of the pull-up transistor T6 may be disposed in a lower layer of a semiconductor layer ACT and the second gate electrode of the pull-up transistor T6 may be disposed in an upper layer of the semiconductor layer ACT.

A gate insulation layer GI of each of the pull-up transistor T6 and the pull-down transistor T7 can be disposed on the semiconductor layer ACT. For example, the gate insulation layer GI of each of the pull-up transistor T6 and the pull-down transistor T7 may be disposed on a portion of the semiconductor layer ACT. The second gate electrode TG1 of the pull-up transistor T6 and the gate electrode TG2 of the pull-down transistor T7 can be disposed on the gate insulation layer GI. The second gate electrode TG1 of the pull-up transistor T6 and the gate electrode TG2 of the pull-down transistor T7 can be defined as an upper gate electrode.

A second insulation layer INS2 covering the second gate electrode TG1 of the pull-up transistor T6 and the gate electrode TG2 of the pull-down transistor T7 can be disposed on the first insulation layer INS1. For example, the second insulation layer INS2 covering the second gate electrode TG1 of the pull-up transistor T6 and the gate electrode TG2 of the pull-down transistor T7 may be disposed on the semiconductor layer ACT. Source drain electrodes SD1 to SD3 of the pull-up transistor T6 and the pull-down transistor T7 can be disposed on the second insulation layer INS2.

The first input line VINH can be connected to the first electrode of the pull-up transistor T6 through a first source drain electrode SD1. The output terminal OUT[1] can be connected to the second electrode of the pull-up transistor T6 and the second electrode of the pull-down transistor T7 through a second source drain electrode SD2. The third input line VINL can be connected to the first electrode of the pull-down transistor T7 through a third source drain electrode SD3.

As seen through comparison of FIGS. 13 and 14, a signal output circuit unit OC according to the comparative example and the signal output circuit unit OC according to the first embodiment can be the same in that including the pull-up transistor T6 and the pull-down transistor T7.

However, the signal output circuit unit OC according to the comparative example can need a circuit for controlling each of a Q node QN and a QB node QBN, but the signal output circuit unit OC according to the first embodiment can need only a circuit which controls the Q node QN.

A condition for driving the pull-up transistor T6 and the pull-down transistor T7 of the comparative example may be the same as an operating state table illustrated under the circuit diagram of FIG. 13 and a condition for driving the pull-up transistor T6 and the pull-down transistor T7 of the first embodiment can be the same as an operating state table illustrated under the circuit diagram of FIG. 14.

Figure 15:
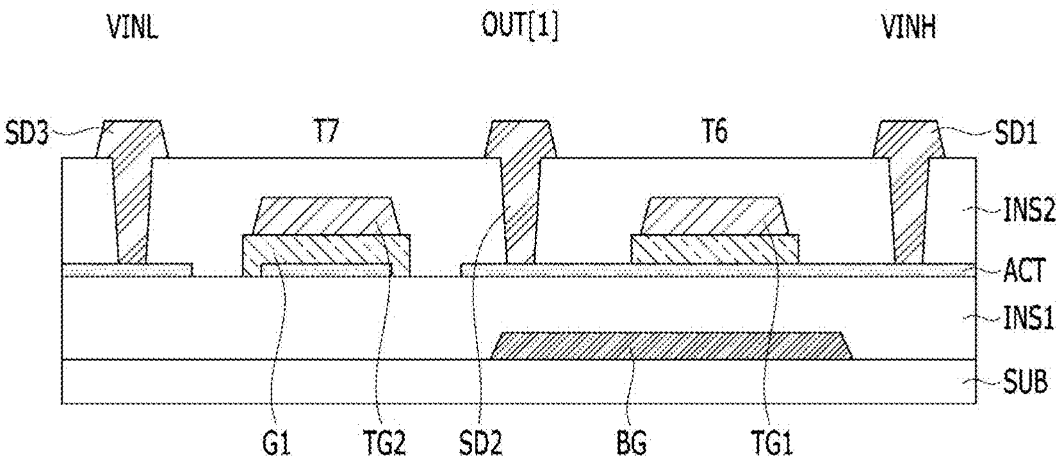
FIG. 15 is a diagram illustrating a cross-sectional surface of each of a pull-up transistor and a pull-down transistor according to a second embodiment of the present disclosure.
Figure 16:
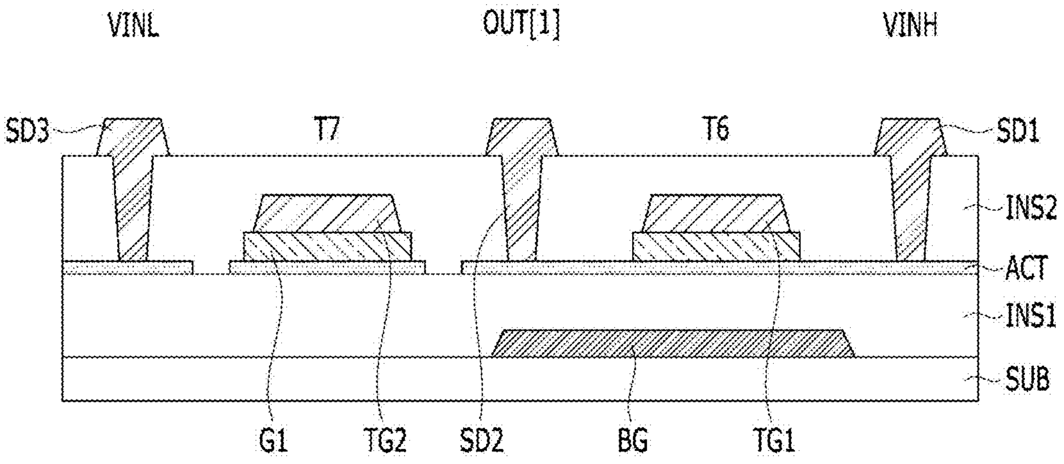
FIG. 16 is a diagram illustrating a cross-sectional surface of each of a pull-up transistor and a pull-down transistor according to a modification example of the second embodiment.

FIG. 15 is a diagram illustrating a cross-sectional surface of each of a pull-up transistor and a pull-down transistor according to a second embodiment of the present disclosure, FIG. 16 is a diagram illustrating a cross-sectional surface of each of a pull-up transistor and a pull-down transistor according to a modification example of the second embodiment, and FIGS. 17 to 20 are diagrams for describing a portion capable of referencing in a case which implements a pull-up transistor and a pull-down transistor, based on the second embodiment.

As illustrated in FIG. 15, according to the second embodiment, a pull-up transistor T6 and a pull-down transistor T7 can have the same layered structure as the first embodiment, but can have some different structures at a periphery of a semiconductor layer ACT. This will be described below.

A semiconductor layer ACT of the pull-down transistor T7 can include a region which exposes a first insulation layer INS1 disposed thereunder. A gate insulation layer GI of the pull-down transistor T7 can be formed in an island shape like a gate electrode TG2 and can include a region covering a portion of each of a side surface and an upper surface of the semiconductor layer ACT and a region covering a portion of an upper surface of the first insulation layer INS1.

A second insulation layer INS2 covering the gate electrode TG2 of the pull-down transistor T7 may be disposed on a portion of the first insulation layer INS1. A second insulation layer INS2 covering the second gate electrode TG1 of the pull-up transistor T6 may be disposed on the semiconductor layer ACT.

As illustrated in FIG. 16, according to the modification example of the second embodiment, a pull-up transistor T6 and a pull-down transistor T7 can have the same layered structure as the first embodiment, but can have some different structures at a periphery of a semiconductor layer ACT. This will be described below.

A semiconductor layer ACT of the pull-down transistor T7 can include a region which exposes a first insulation layer INS1 disposed thereunder. A gate insulation layer GI of the pull-down transistor T7 can be formed in an island shape like a gate electrode TG2 and can include a region covering a portion of the semiconductor layer ACT. That is, as illustrated in FIG. 17, a width of the semiconductor layer ACT located below the gate insulation layer GI of the pull-down transistor T7 may be greater than that of gate insulation layer GI of the pull-down transistor T7.

Figure 17:
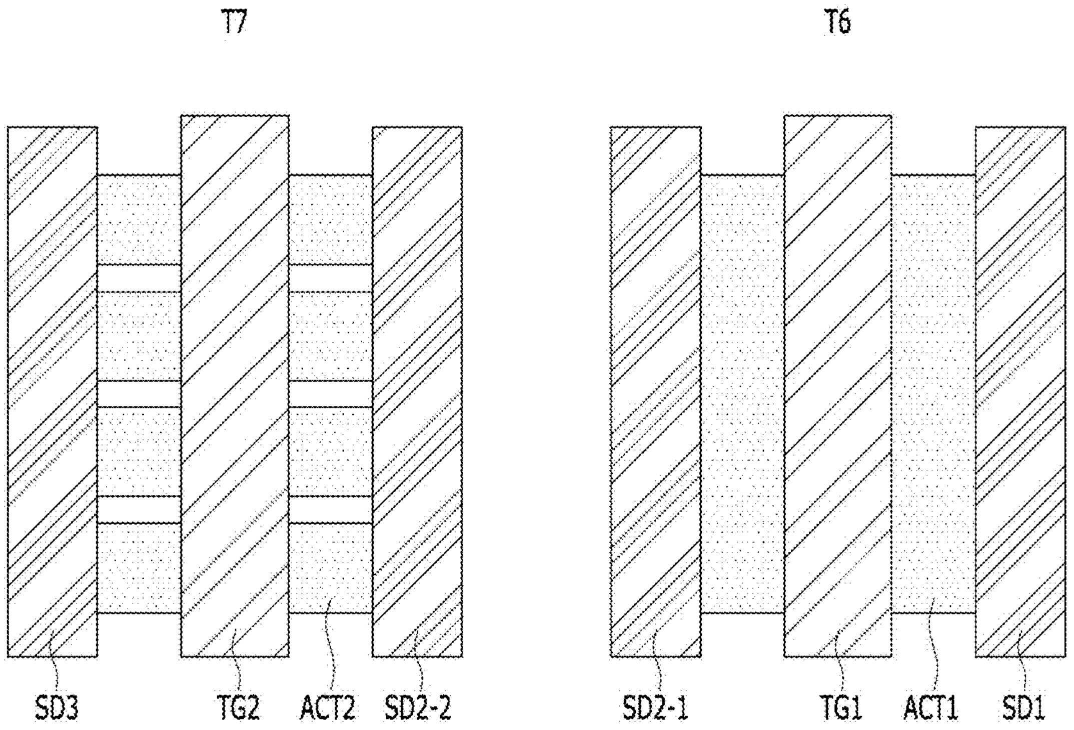
FIGS. 17 to 20 are diagrams for describing a portion capable of referencing in a case which implements a pull-up transistor and a pull-down transistor, based on the second embodiment.
Figure 18:
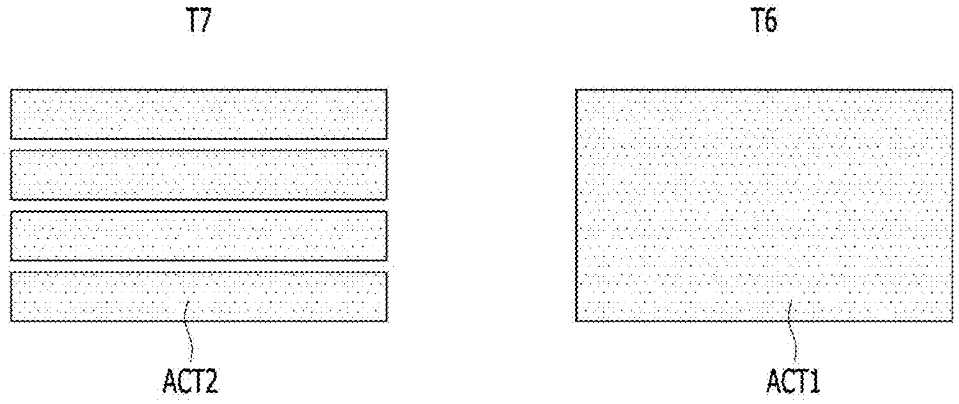

As illustrated in FIGS. 17 and 18, according to the second embodiment, a first semiconductor layer ACT1 of the pull-up transistor T6 can have a rectangular shape. A second semiconductor layer ACT2 of the pull-down transistor T7 can have a rectangular shape and can have the same size as that of the first semiconductor layer ACT1 of the pull-up transistor T6, or can have a rectangular shape (a stripe shape) which is patterned in a first direction (a horizontal direction) and divided into four portions. For example, the first semiconductor layer ACT1 of the pull-up transistor T6 and the second semiconductor layer ACT2 of the pull-down transistor T7 can have different shapes.

Figure 19:
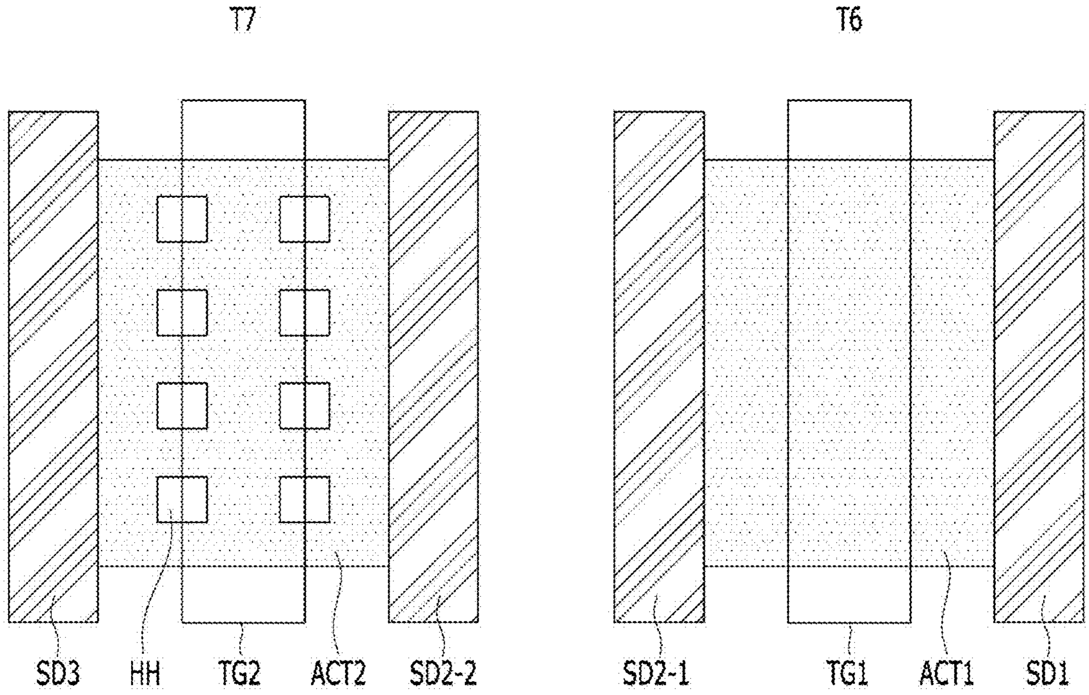

As illustrated in FIG. 19, according to the modification example of the second embodiment, a first semiconductor layer ACT1 of the pull-up transistor T6 can have a rectangular shape. A second semiconductor layer ACT2 of the pull-down transistor T7 can have a rectangular shape and can have the same size as that of the first semiconductor layer ACT1 of the pull-up transistor T6, but a plurality of grooves HH can be provided in a region adjacent to the gate electrode TG2 of the pull-down transistor T7.

Figure 20:
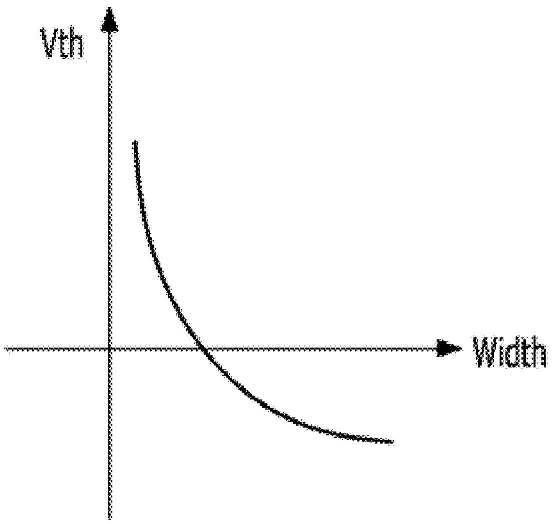

As illustrated in FIG. 20, a threshold voltage Vth of a transistor can be shifted based on a width of a channel region of a semiconductor layer. Therefore, the pull-up transistor T6 illustrated in FIGS. 17 to 19 can have a negative threshold voltage characteristic as a width of the channel region of the semiconductor layer is wide, and the pull-down transistor T7 can have a positive threshold voltage characteristic as a width of the channel region of the semiconductor layer is relatively narrow.

Therefore, the pull-up transistor T6 and the pull-down transistor T7 can be implemented based on the same configuration and structure and can have different threshold voltage characteristics by changing a shape of the semiconductor layer.

Furthermore, in FIGS. 17 and 19, second source drain electrodes SD2-1 and SD2-2 connecting the pull-up transistor T6 and the pull-down transistor T7 with each other are illustrated to be isolated from each other, so as to easily determine a structural difference between the pull-up transistor T6 and the pull-down transistor T7. Further, in FIG. 19, only a border of each of the gate electrodes TG1 and TG2 is illustrated so as to easily determine a structural difference between the pull-up transistor T6 and the pull-down transistor T7.

Figure 21:
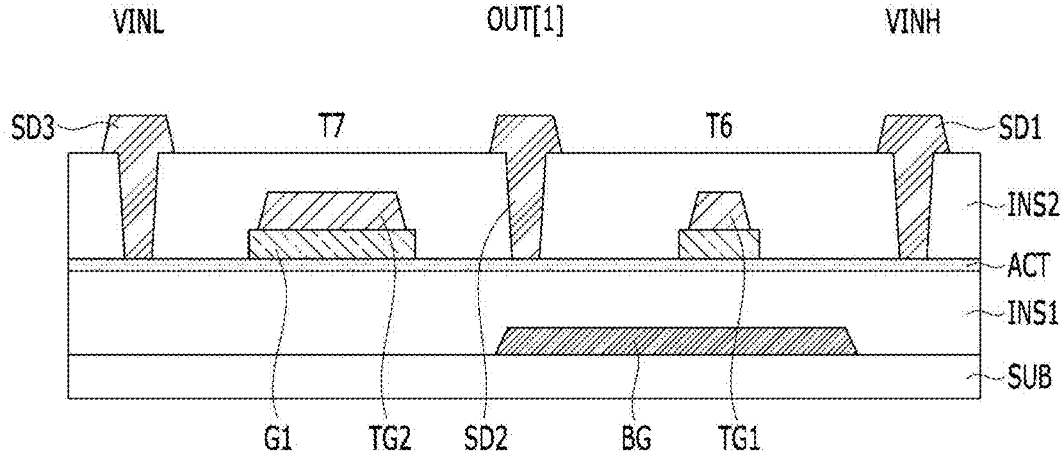
FIG. 21 is a diagram illustrating a cross-sectional surface of each of a pull-up transistor and a pull-down transistor according to a third embodiment of the present disclosure.
Figure 22:
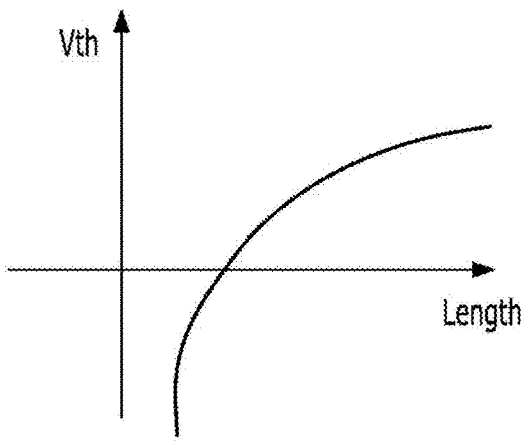
FIG. 22 is a diagram for describing a portion capable of referencing in a case which implements a pull-up transistor and a pull-down transistor, based on the third embodiment.

FIG. 21 is a diagram illustrating a cross-sectional surface of each of a pull-up transistor and a pull-down transistor according to a third embodiment of the present disclosure, and FIG. 22 is a diagram for describing a portion capable of referencing in a case which implements a pull-up transistor and a pull-down transistor, based on the third embodiment.

As illustrated in FIG. 21, according to the third embodiment, a pull-up transistor T6 and a pull-down transistor T7 can have the same layered structure as the first embodiment, but can have some different structures in elements disposed on a semiconductor layer ACT. This will be described below.

A gate insulation layer GI and a gate electrode TG2 disposed on a semiconductor layer ACT of the pull-down transistor T7 can have a length which is longer than a gate insulation layer GI and a gate electrode TG1 disposed on a semiconductor layer ACT of the pull-up transistor T6. To provide the other description, the pull-down transistor T7 can have a channel region which is longer than the pull-up transistor T6.

As illustrated in FIG. 22, a threshold voltage Vth of a transistor can be shifted based on a length of a channel region of a semiconductor layer. Therefore, the pull-up transistor T6 illustrated in FIG. 21 can have a negative threshold voltage characteristic as a length of the channel region of the semiconductor layer is short, and the pull-down transistor T7 can have a positive threshold voltage characteristic as a length of the channel region of the semiconductor layer is relatively long.

Therefore, the pull-up transistor T6 and the pull-down transistor T7 can be implemented based on the same configuration and structure and can have different threshold voltage characteristics by changing a shape of an element disposed on the semiconductor layer.

Figure 23:
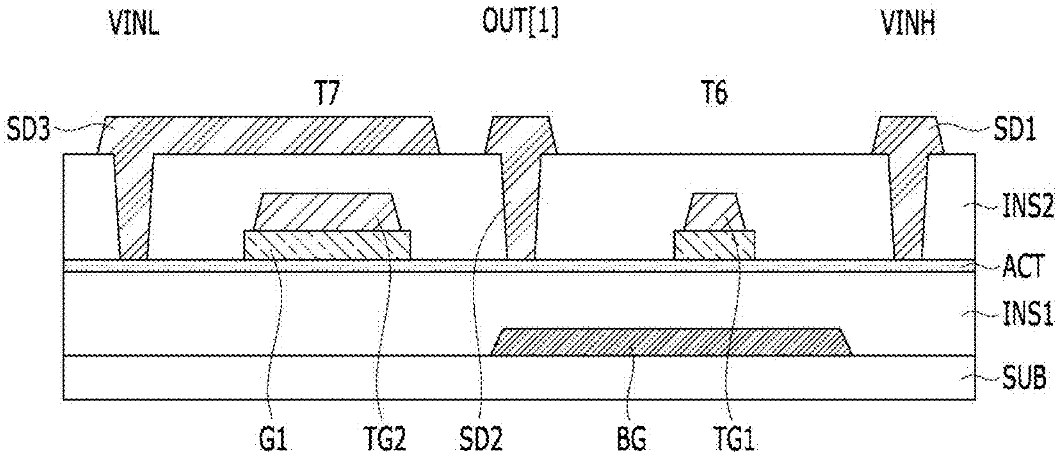
FIG. 23 is a diagram illustrating a cross-sectional surface of each of a pull-up transistor and a pull-down transistor according to a fourth embodiment of the present disclosure.

FIG. 23 is a diagram illustrating a cross-sectional surface of each of a pull-up transistor and a pull-down transistor according to a fourth embodiment of the present disclosure.

As illustrated in FIG. 23, according to the fourth embodiment, a pull-up transistor T6 and a pull-down transistor T7 can have the same layered structure as the first embodiment, but can have some different structures in elements disposed on a second insulation layer INS2. This will be described below. Also, according to the fourth exemplary embodiment, a pull-up transistor T6 and a pull-down transistor T7 may have some different structures in elements disposed on a semiconductor layer ACT. This will be described below.

A gate insulation layer GI and a gate electrode TG2 disposed on a semiconductor layer ACT of the pull-down transistor T7 may have a length which is longer than a gate insulation layer GI and a gate electrode TG1 disposed on a semiconductor layer ACT of the pull-up transistor T6. To provide the other description, the pull-down transistor T7 may have a channel region which is longer than the pull-up transistor T6.

Also, a third source drain electrode SD3 disposed on a second insulation layer INS2 of the pull-down transistor T7 can extend up to a region adjacent to a second source drain electrode SD2 to cover a gate electrode TG2 disposed under the second insulation layer INS2.

A hydrogen component can be on the second insulation layer INS2, and a third source drain electrode SD3 extending up to a region adjacent to the second source drain electrode SD2 can block the hydrogen component. To provide the other description, in the fourth embodiment, the pull-down transistor T7 can have a positive threshold voltage characteristic by using a hydrogen blocking structure for blocking the hydrogen component which is on the second insulation layer INS2.

Furthermore, in the second to fourth embodiments, for example, a threshold voltage of the pull-up transistor T6 and a threshold voltage of the pull-down transistor T7 can be differently implemented based on a transistor structure described in the first embodiment. However, a structure of a transistor applicable to the present disclosure is not limited thereto, and an example thereof will be described below.

Figure 24:
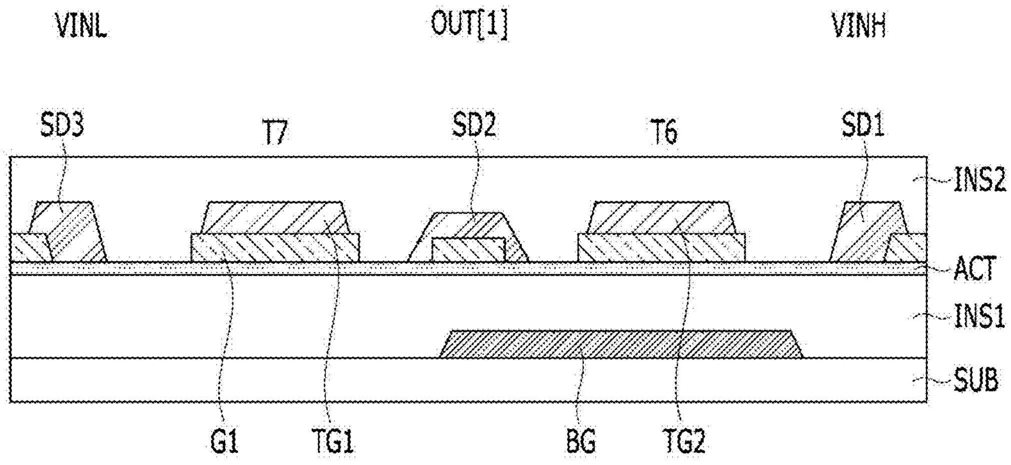
FIGS. 24 to 26 are diagrams for describing a structure of a transistor according to another embodiment of the present disclosure.
Figure 25:
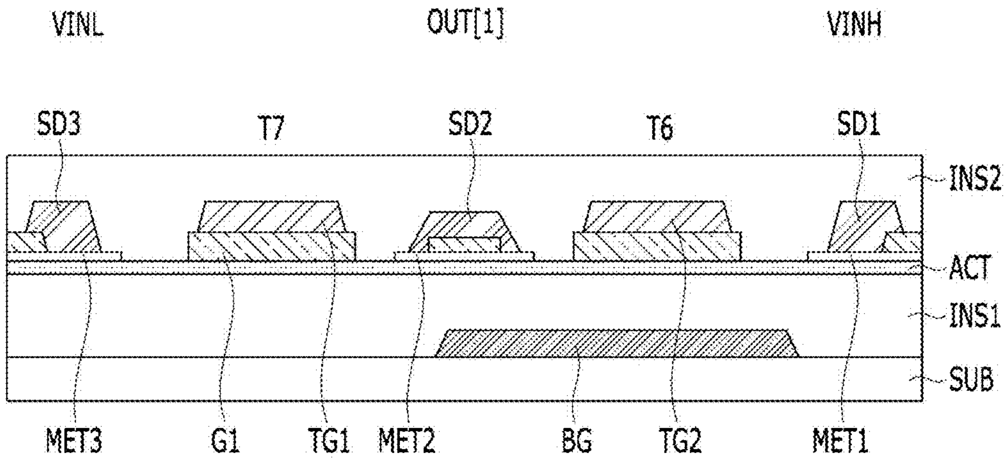
Figure 26:
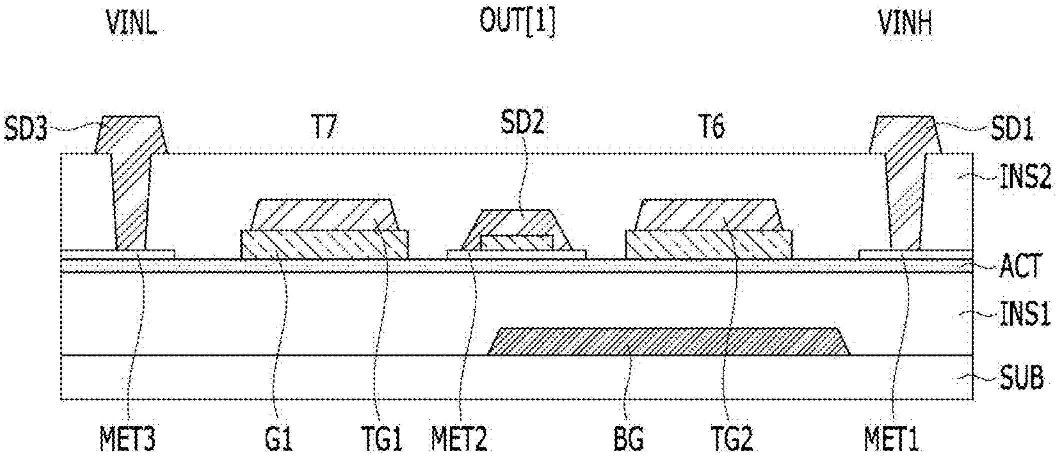

FIGS. 24 to 26 are diagrams for describing a structure of a transistor according to another embodiment of the present disclosure. Hereinafter, in another embodiment, a difference with a structure of a transistor described in the first embodiment will be mainly described.

As illustrated in FIG. 24, a gate insulation layer GI can be disposed in an island shape, based on positions of electrodes SD1 to SD3, TG1, and TG2 on a semiconductor layer ACT of each of a pull-up transistor T6 and a pull-down transistor T7. A first source drain electrode SD1, a second source drain electrode SD2, and a third source drain electrode SD3 can be formed of the same material as that of gate electrodes TG1 and TG2 (for example, a gate metal layer) and can cover a portion of an upper surface of the semiconductor layer ACT and a portion of each of an upper surface and a side surface of the gate insulation layer GI disposed in an island shape, without being limited thereto.

As illustrated in FIG. 25, according to the second embodiment, a first metal electrode MET1, a second metal electrode MET2, and a third metal electrode MET3 can be disposed in an island shape, based on positions of a first source drain electrode SD1, a second source drain electrode SD2, and a third source drain electrode SD3 on a semiconductor layer ACT of each of a pull-up transistor T6 and a pull-down transistor T7. A gate insulation layer GI can be disposed in an island shape, based on positions of the first metal electrode MET1, the second metal electrode MET2, and the third metal electrode MET3. The first source drain electrode SD1, the second source drain electrode SD2, and the third source drain electrode SD3 can be formed of the same material as that of gate electrodes TG1 and TG2 (for example, a gate metal layer) and can cover a portion of an upper surface of the electrodes MET1 to MET3 and a portion of each of an upper surface and a side surface of the gate insulation layer GI disposed in an island shape, without being limited thereto.

As illustrated in FIG. 26, according to the third embodiment, a first metal electrode MET1, a second metal electrode MET2, and a third metal electrode MET3 can be disposed in an island shape, based on positions of a first source drain electrode SD1, a second source drain electrode SD2, and a third source drain electrode SD3 on a semiconductor layer ACT of each of a pull-up transistor T6 and a pull-down transistor T7. The second source drain electrode SD2 can be formed of the same material as that of gate electrodes TG1 and TG2 (for example, a gate metal layer) and can cover a portion of an upper surface of the second metal electrode MET2 and a portion of each of an upper surface and a side surface of the gate insulation layer GI disposed in an island shape. The first source drain electrode SD1 and the third source drain electrode SD3 can be disposed on a second insulation layer INS2 and can be connected to the first metal electrode MET1 and the third metal electrode MET3 through a contact hole formed in the second insulation layer INS2. That is, in the first and second exemplary embodiments of FIGS. 24 and 25, the first source drain electrode SD1, the second source drain electrode SD2 and the third source drain electrode SD3 may be disposed under the second insulation layer INS2. However, in the third exemplary embodiment of FIG. 26, the first source drain electrode SD1 and the third source drain electrode SD3 may be disposed on the second insulation layer INS2, and the second source drain electrode SD2 may be disposed under the second insulation layer INS2.

The pull-up transistor T6 and the pull-down transistor T7 illustrated and described in FIGS. 24 to 26 can be implemented to have different threshold voltages, based on a method described in the first to fourth embodiments.

Moreover, a configuration of a signal output circuit unit capable of being applied based on the present disclosure can be diversified in addition to the first embodiment, and thus, this can be described as follows.

Figure 27:
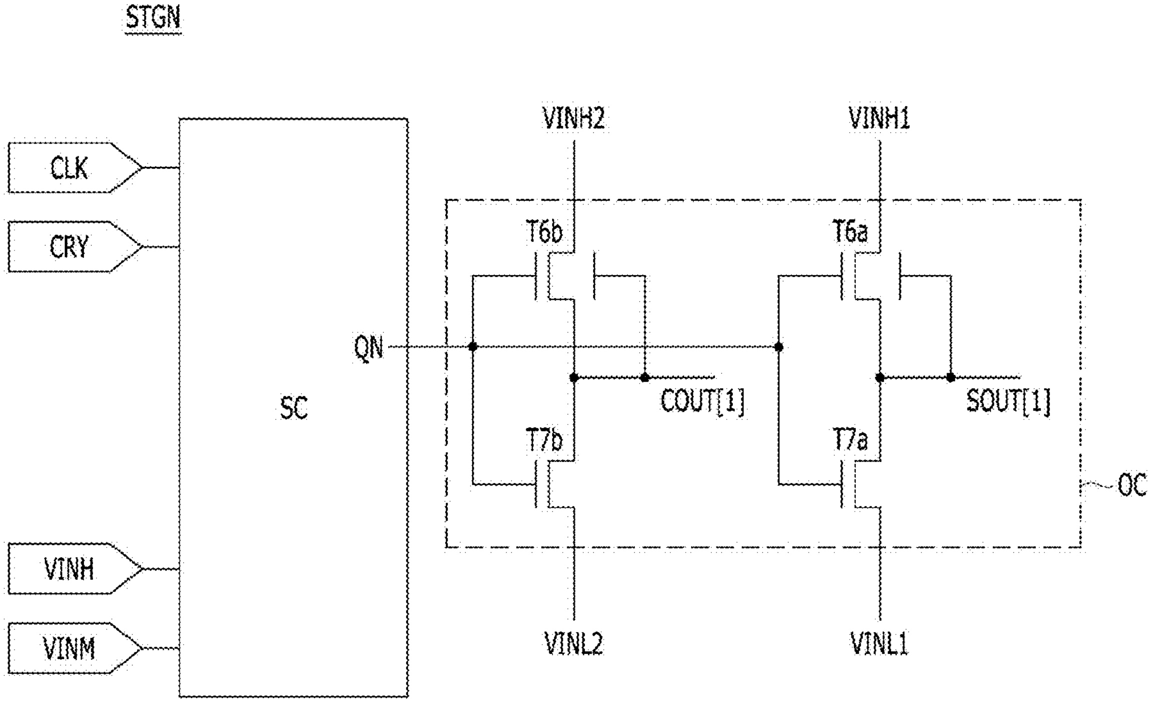
FIGS. 27 and 28 are diagrams illustrating some elements of an $N^{th}$ stage according to another embodiment of the present disclosure.
Figure 28:
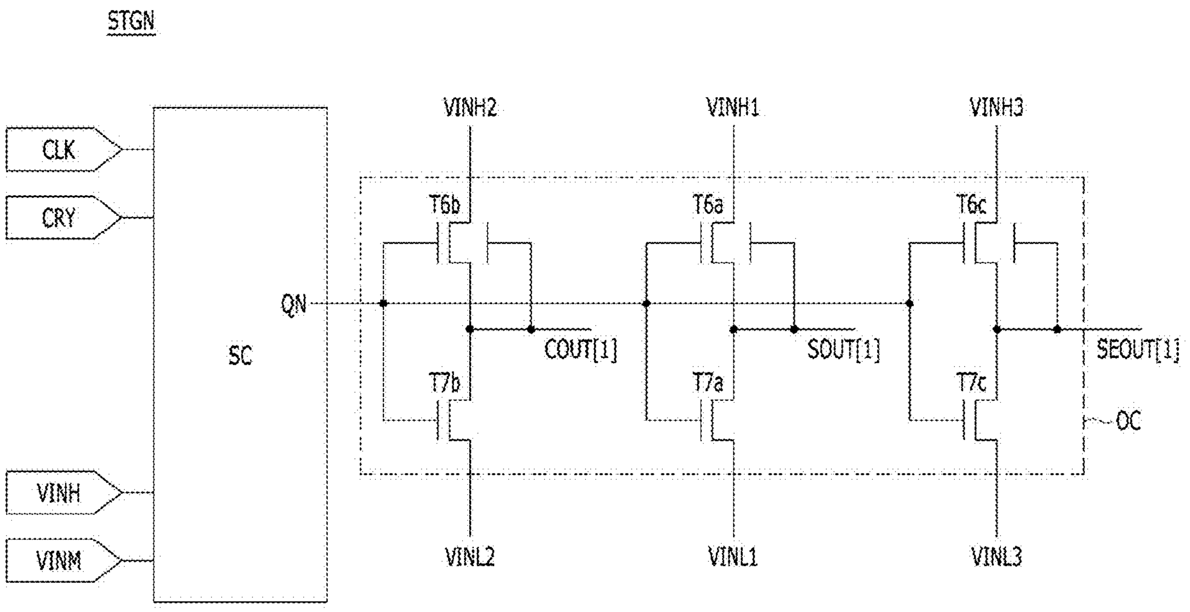

FIGS. 27 and 28 are diagrams illustrating some elements of an $N^{th}$ stage according to another embodiment of the present disclosure.

As illustrated in FIG. 27, according to the first embodiment, a signal output circuit unit OC can include a first output terminal SCOUT[1] which outputs a gate signal and a second output terminal COUT[1] which outputs a carry signal.

A first pull-up transistor T6*a* and a first pull-down transistor T7*a* disposed on the first output terminal SCOUT[1] and a second pull-up transistor T6*b* and a second pull-down transistor T7*b* disposed on the second output terminal COUT[1] can each include a gate electrode which is connected to a Q node QN of the signal control circuit unit SC in common.

The first pull-up transistor Toa and the first pull-down transistor T7*a* disposed on the first output terminal SCOUT [1] can have different threshold voltage characteristics, and the second pull-up transistor T6*b* and the second pull-down transistor T7*b* disposed on the second output terminal COUT[1] can have different threshold voltage characteristics.

The first pull-up transistor T6*a* can be connected to a first-1 input line VINH1, the first pull-down transistor T7*a* can be connected to a third-1 input line VINL1, the second pull-up transistor T6*b* can be connected to a first-2 input line VINH2, and the second pull-down transistor T7*b* can be connected to a third-2 input line VINL2. Here, a voltage provided in a clock signal form can be applied to some (for example, VINH1 and VINH2) of the input lines VINH1, VINH2, VINL1, and VINL2.

As illustrated in FIG. 28, according to the second embodiment, a signal output circuit unit OC can include a first output terminal SCOUT[1] which outputs a first gate signal, a second output terminal COUT[1] which outputs a carry signal, and a third output terminal SECOUT[1] which outputs a second gate signal.

A first pull-up transistor T6*a* and a first pull-down transistor T7*a* disposed on the first output terminal SCOUT[1], a second pull-up transistor T6*b* and a second pull-down transistor T7*b* disposed on the second output terminal COUT[1], and a third pull-up transistor T6*c* and a third pull-down transistor T7*c* disposed on the third output terminal SECOUT[1] can each include a gate electrode which is connected to a Q node QN of the signal control circuit unit SC in common.

The first pull-up transistor T6*a* and the first pull-down transistor T7*a* disposed on the first output terminal SCOUT [1] can have different threshold voltage characteristics. Further, the second pull-up transistor T6*b* and the second pull-down transistor T7*b* disposed on the second output terminal COUT[1] can have different threshold voltage characteristics. Further, the third pull-up transistor T6*c* and the third pull-down transistor T7*c* disposed on the third output terminal SECOUT[1] can have different threshold voltage characteristics.

The first pull-up transistor T6*a* can be connected to a first-1 input line VINH1, the first pull-down transistor T7*a* can be connected to a third-1 input line VINL1, the second pull-up transistor T6*b* can be connected to a first-2 input line VINH2, the second pull-down transistor T7*b* can be connected to a third-2 input line VINL2, the third pull-up transistor T6*c* can be connected to a first-3 input line VINH3, and the third pull-down transistor T7*c* can be connected to a third-2 input line VINL3. Here, a voltage provided in a clock signal form can be applied to some (for example, VINH1, VINH2, and VINH3) of the input lines VINH1, VINH2, VINH3, VINL1, VINL2, and VINL3.

Exemplary embodiments of the disclosure described above are briefly described below.

According to exemplary embodiments of the disclosure, there may be provided a display device including: a display panel configured to display an image; and a gate signal generating circuit configured to supply a gate signal to the display panel, wherein the gate signal generating circuit includes a signal control circuit configured to control a Q node and a signal output circuit configured to operate based on a voltage of the Q node to output the gate signal, and the signal output circuit includes at least one pull-up transistor and at least one pull-down transistor each including a gate electrode connected to the Q node in common.

According to exemplary embodiments of the disclosure, there may be provided a display device including: a display panel configured to display an image; and a gate signal generating circuit configured to supply a gate signal to the display panel, wherein the gate signal generating circuit includes a signal control circuit configured to control a Q node and a signal output circuit configured to operate based on a voltage of the Q node to output the gate signal, and the signal output circuit includes at least one pull-up transistor and at least one pull-down transistor each including a gate electrode connected to the Q node in common, and wherein pull-up transistor has a negative threshold voltage characteristic, and the pull-down transistor has a positive threshold voltage characteristic.

The present disclosure can have an effect where a CMOS circuit is implemented based on at least two transistors having different threshold voltage characteristics. Further, the present disclosure can simplify a circuit configuring a shift register, based on at least two transistors having different threshold voltage characteristics. Further, the present disclosure can simplify a circuit configuring a shift register to implement a narrow bezel of a display panel. Further, the present disclosure can increase the mobility of a current by using gate electrodes respectively disposed in an upper layer and a lower layer of a semiconductor layer.

The effects according to the present disclosure are not limited to the above examples, and other various effects can be included in the disclosure.

While the present disclosure has been particularly shown and described with reference to example embodiments thereof, it will be understood by those of ordinary skill in the art that various changes in form and details can be made therein without departing from the spirit and scope of the present disclosure as defined by the following claims.

What is claimed is:

1. A display device comprising: a display panel configured to display an image; and a gate signal generating circuit configured to supply a gate signal to the display panel, wherein the gate signal generating circuit comprises a signal control circuit configured to control a Q node and a signal output circuit configured to operate based on a voltage of the Q node to output the gate signal, and wherein the signal output circuit comprises at least one pull-up transistor and at least one pull-down transistor each including a gate electrode connected to the Q node in common, wherein the at least one pull-up transistor comprises a first gate electrode disposed in a lower layer of a semiconductor layer and a second gate electrode disposed in an upper layer of the semiconductor layer, wherein, when the at least one pull-up transistor is turned on, a first voltage is applied to the first gate electrode, and a second voltage which is lower than the first voltage is applied to the second gate electrode, and wherein, when the at least one pull-up transistor is turned off, a third voltage which is lower than the second voltage is applied to the first gate electrode, and the first voltage is applied to the second gate electrode.

2. The display device of claim 1, wherein at least one of the at least one pull-up transistor and the at least one pull-down transistor comprises the first gate electrode and the second gate electrode.

3. The display device of claim 1, wherein the first gate electrode is connected to an output terminal of the signal output circuit.

4. The display device of claim 1, wherein, in the at least one pull-up transistor or the at least one pull-down transistor, a shape of at least one of a semiconductor layer, a gate insulation layer, and a gate electrode differs.

5. A gate signal generating circuit comprising:

a signal control circuit configured to control a Q node; and a signal output circuit configured to operate based on a voltage of the Q node to output a gate signal, wherein the signal output circuit comprises at least one pull-up transistor and at least one pull-down transistor each including a gate electrode connected to the Q node in common, wherein the at least one pull-up transistor comprises a first gate electrode disposed in a lower layer of a semiconductor layer and a second gate electrode disposed in an upper layer of the semiconductor layer, wherein, when the at least one pull-up transistor is turned on, a first voltage is applied to the first gate electrode, and a second voltage which is lower than the first voltage is applied to the second gate electrode, and when the at least one pull-up transistor is turned off, a third voltage which is lower than the second voltage is applied to the first gate electrode, and the first voltage is applied to the second gate electrode.

6. The gate signal generating circuit of claim 5, wherein the first gate electrode is connected to an output terminal of the signal output circuit.

7. The gate signal generating circuit of claim 5, wherein, in the at least one pull-up transistor or the at least one pull-down transistor, a shape of at least one of a semiconductor layer, a gate insulation layer, and a gate electrode differs.

8. A display device comprising:

a display panel configured to display an image; and a gate signal generating circuit configured to supply a gate signal to the display panel, wherein the gate signal generating circuit comprises a signal control circuit configured to control a Q node and a signal output circuit configured to operate based on a voltage of the Q node to output the gate signal, and the signal output circuit comprises at least one pull-up transistor and at least one pull-down transistor each including a gate electrode connected to the Q node in common, wherein the pull-up transistor has a negative threshold voltage characteristic, and the pull-down transistor has a positive threshold voltage characteristic, wherein the at least one pull-up transistor comprises a first gate electrode disposed in a lower layer of a semiconductor layer and a second gate electrode disposed in an upper layer of the semiconductor layer, wherein, when the at least one pull-up transistor is turned on, a first voltage is applied to the first gate electrode, and a second voltage which is lower than the first voltage is applied to the second gate electrode, and when the at least one pull-up transistor is turned off, a third voltage which is lower than the second voltage is applied to the first gate electrode, and the first voltage is applied to the second gate electrode.

* * * * *